(12) United States Patent
Rozen et al.

(10) Patent No.: US 11,568,927 B2
(45) Date of Patent: Jan. 31, 2023

(54) TWO-TERMINAL NON-VOLATILE MEMORY CELL FOR DECOUPLED READ AND WRITE OPERATIONS

(71) Applicant: INTERNATIONAL BUSINESS MACHINES CORPORATION, Armonk, NY (US)

(72) Inventors: John Rozen, Hastings on Hudson, NY (US); Seyoung Kim, Pohang (KR); Paul Michael Solomon, Westchester, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/217,767

(22) Filed: Mar. 30, 2021

(65) Prior Publication Data
US 2022/0319588 A1  Oct. 6, 2022

(51) Int. Cl.
*G11C 13/00* (2006.01)
*G11C 11/56* (2006.01)
*H01L 45/00* (2006.01)

(52) U.S. Cl.
CPC ........ *G11C 11/5614* (2013.01); *G11C 13/004* (2013.01); *G11C 13/0011* (2013.01);
(Continued)

(58) Field of Classification Search
CPC ............ G11C 11/5614; G11C 13/0011; G11C 13/004; G11C 13/0069; G11C 2013/005;
(Continued)

(56) References Cited

U.S. PATENT DOCUMENTS 7,989,902 B2  8/2011  Ando
9,224,946 B2  12/2015  Kim
(Continued)

FOREIGN PATENT DOCUMENTS

WO   2021216842 A1   10/2021

OTHER PUBLICATIONS

Chen, et al., "A CMOS-compatible electronic synapse device based on Cu/SiO2/W programmable metallization cells," Nanotechnology 27 255202, 2016, 10 pages, vol. 27, No. 25, IO Publishing Ltd., UK, DOI: 10.1088/0957-4484/27/25/255202, Retrieved from the Internet: <URL: https://iopscience.iop.org/article/10.1088/0957-4484/27/25/255202>.

(Continued)

*Primary Examiner* — Michael T Tran
(74) *Attorney, Agent, or Firm* — L. Jeffrey Kelly

(57) ABSTRACT

An embodiment of the invention may include a memory structure. The memory structure may include a first terminal connected to a first contact. The memory structure may include a second terminal connected to a second contact and a third contact. The memory structure may include a multi-level nonvolatile electrochemical cell having a variable resistance channel and a programming gate. The memory structure may include the first contact and second contact connected to the variable resistance channel. The memory structure may include the third contact is connected to the programming gate. This may enable decoupled read-write operations of the device.

24 Claims, 5 Drawing Sheets

(52) U.S. Cl.
CPC ........ *G11C 13/0069* (2013.01); *H01L 45/085* (2013.01); *H01L 45/146* (2013.01); *G11C 2013/005* (2013.01); *G11C 2013/0071* (2013.01)

(58) Field of Classification Search
CPC .......... G11C 2013/0071; H01L 45/085; H01L 45/146
USPC ................................................ 365/148, 153
See application file for complete search history.

(56) References Cited

U.S. PATENT DOCUMENTS

| | | | |
|---|---|---|---|
| 9,601,692 B1* | 3/2017 | Jo | G11C 13/0097 |
| 9,887,351 B1 | 2/2018 | Ando | |
| 10,079,341 B1 | 9/2018 | Bedell | |
| 10,090,461 B2 | 10/2018 | Karpov | |
| 10,186,657 B2 | 1/2019 | Brew | |
| 10,366,323 B2 | 7/2019 | Ando | |
| 10,429,343 B1 | 10/2019 | Talin | |
| 10,497,866 B1* | 12/2019 | Fuller | G11C 7/1006 |
| 10,586,591 B2 | 3/2020 | Li | |
| 10,748,059 B2 | 8/2020 | Copel | |
| 10,810,506 B1 | 10/2020 | Zota | |
| 2004/0064660 A1* | 4/2004 | Lyons | G06F 13/4243 711/167 |
| 2005/0243596 A1* | 11/2005 | Symanczyk | H01L 45/143 257/E45.002 |
| 2009/0207645 A1* | 8/2009 | Parkinson | G11C 13/0011 365/158 |
| 2009/0231907 A1* | 9/2009 | Bloch | G11C 13/02 365/153 |
| 2009/0289240 A1* | 11/2009 | Wang | H01L 45/1658 257/E45.002 |
| 2010/0123542 A1* | 5/2010 | Vaithyanathan | H01L 45/124 338/20 |
| 2011/0272664 A1* | 11/2011 | Tada | H01L 45/1253 257/4 |
| 2012/0097916 A1* | 4/2012 | Tada | H01L 45/1625 257/4 |
| 2012/0275211 A1* | 11/2012 | Yi | G11C 13/0023 365/148 |
| 2012/0319072 A1* | 12/2012 | Wei | H01L 27/249 257/E47.001 |
| 2013/0140648 A1* | 6/2013 | Hasegawa | G11C 14/00 257/411 |
| 2015/0024298 A1* | 1/2015 | Blanchet | H01M 8/04902 429/432 |
| 2015/0162081 A1* | 6/2015 | Molas | G11C 7/1078 711/105 |
| 2015/0340606 A1* | 11/2015 | Tada | H01L 45/1683 257/4 |
| 2017/0365641 A1 | 12/2017 | Bedau | |
| 2018/0166197 A1* | 6/2018 | Wang | H01L 43/10 |
| 2018/0197917 A1 | 7/2018 | Ando | |
| 2018/0219155 A1 | 8/2018 | Ando | |
| 2019/0245543 A1* | 8/2019 | Lee | G11C 13/004 |
| 2019/0378004 A1 | 12/2019 | Todorov | |
| 2020/0066797 A1 | 2/2020 | Kong | |
| 2020/0066968 A1* | 2/2020 | Park | H01L 43/12 |
| 2020/0075860 A1 | 3/2020 | Ando | |
| 2020/0227635 A1* | 7/2020 | Yang | H01L 45/146 |
| 2020/0243762 A1* | 7/2020 | Wagner | H01L 45/142 |
| 2020/0273911 A1* | 8/2020 | Tang | H01L 45/146 |
| 2020/0286536 A1* | 9/2020 | Fukami | H01L 27/228 |
| 2021/0066394 A1* | 3/2021 | Conti | H01L 23/5226 |

OTHER PUBLICATIONS

Fuller, et al., "Parallel programming of an ionic floating-gate memory array for scalable neuromorphic computing," Science, May 10, 2019, 5 pages, vol. 364, Issue 6440, DOI: 10.1126/science.aaw5581, Retrieved from the Internet: <URL: https://science.sciencemag.org/content/364/6440/570/tab-pdf>.

Gokmen, et al., "Acceleration of Deep Neural Network Training with Resistive Cross-Point Devices: Design Considerations," Frontiers in Neuroscience, Jul. 21, 2016, 13 pages, vol. 10, Art. 333, DOI: 10.3389/fnins.2016.00333, Retrieved from the Internet: <URL:https://www.frontiersin.org/articles/10.3389/fnins.2016.00333/full.

Kim, et al., "Metal-oxide based, CMOS-compatible ECRAM for Deep Learning Accelerator," 2019 IEEE International Electron Devices Meeting (IEDM), Dec. 7-11, 2019 [accessed on Jan. 4, 2021], 4 pages, IEEE, DOI: 10.1109/IEDM19573.2019.8993463, Retrieved from the Internet: <URL: https://ieeexplore.ieee.org/document/8993463>.

Rozen, et al., "Metal-Oxide-Based Neuromorphic Device," Application and Drawings, Filed on Jul. 17, 2019, 51 Pages, U.S. Appl. No. 16/513,871.

Tang, et al., "ECRAM as Scalable Synaptic Cell for High-Speed, Low-Power Neuromorphic Computing," 2018 IEEE International Electron Devices Meeting (IEDM), Dec. 1-5, 2018 [accessed on Jan. 4, 2021], 4 pages, IEEE, San Francisco, CA, USA, DOI: 10.1109/IEDM.2018.8614551, Retrieved from the Internet: <URL: https://ieeexplore.ieee.org/abstract/document/8614551>.

Van De Burgt, et al., "Organic electronics for neuromorphic computing," Nature Electronics 1, Jul. 13, 2018 [accessed on Jan. 4, 2021], 18 pages, Retrieved from the Internet: <URL: https://www.nature.com/articles/s41928-018-0103-3>.

Lee, et al., "Two-Terminal Structured Synaptic Device Using Ionic Electrochemical Reaction Mechanism for Neuromorphic System," IEEE Electron Device Letters, Apr. 2019 [accessed on Oct. 2, 2020], vol. 40, No. 4, pp. 546-549.

Li, et al., "Low-Voltage, CMOS-Free Synaptic Memory Based on LixTiO2 Redox Transistors," ACS Applied Materials & Interfaces, 2019 [accessed on Oct. 2, 2020], vol. 11, No. 42, pp. 38982-38992, ACS Publications, Retrieved from the Internet: <URL: https://pubs.acs.org/doi/10.1021/acsami.9b14338>.

IBM: List of IBM Patents or Patent Applications Treated as Related (Appendix P), Mar. 30, 2021, 2 pages.

Rozen, "Three-Dimensional Confined Memory Cell With Decoupled Read-Write," Application and Drawings, Filed on Mar. 30, 2021, 21 Pages, Related U.S. Appl. No. 17/217,788.

* cited by examiner

TWO-TERMINAL NON-VOLATILE MEMORY CELL FOR DECOUPLED READ AND WRITE OPERATIONS

BACKGROUND

The present invention relates to memory devices, and more specifically, to resistive analog memory devices.

Technical problems such as character recognition and image recognition by a computer are known to be well handled by machine-learning techniques. "Machine learning" is used to broadly describe a primary function of electronic systems that learn from data. In machine learning and cognitive science, artificial neural networks (ANNs) are a family of statistical learning models inspired by the biological neural networks of animals, and in particular the brain. ANNs can be used to estimate or approximate systems and functions that depend on a large number of inputs and are generally unknown. ANNs can include deep neural networks (DNNs), convolutional neural networks (CNNs), and other types of neural networks. Crossbar arrays are high density, low cost circuit architectures used to form a variety of electronic circuits and devices, including ANN architectures, neuromorphic microchips and ultra-high density non-volatile memory. A basic cross-bar array configuration includes a set of conductive row wires and a set of conductive column wires formed to intersect the set of conductive row wires. The intersections between the two sets of wires are separated by so-called cross-point devices. Such cross-point devices may be analog memory devices capable of storing a weighted value (e.g., 0-1 instead of the binary 0 or 1), and may be capable of use in analog computing devices.

Cross-point devices can be implemented as so-called resistive memory (colloquially, memristive) devices. Characteristics of a memristive device may include non-volatility, the ability to store a variable analog resistance value, the ability to determine the analog resistance value without disturbing the state of the memristive device, and the ability to tune up or tune down a resistance using current or voltage pulses. These memristive devices can be used in hardware to simulate the artificial synapses of an ANN.

BRIEF SUMMARY

An embodiment of the invention may include a memory structure. The memory structure may include a multi-level nonvolatile electrochemical cell connected to a first terminal and a second terminal. The memory structure may be arranged such that a read path between the first terminal and second terminal is different than the write path between the first terminal and the second terminal. This may enable decoupled read-write operations of the device.

An embodiment of the multi-level nonvolatile electrochemical cell of the memory structure may include a programming gate above a variable resistance channel. This may enable decoupled read-write operations of the device.

An embodiment of the programming gate may include using an ion exchange layer as the programming gate. This may enable operating the device as a nonvolatile electrochemical memory cell.

An embodiment of the programming gate may further include a metal-containing reservoir. This may enable operating the device as a nonvolatile electrochemical memory cell.

An embodiment of the multi-level nonvolatile electrochemical cell of the memory structure may include the path of the write operation occurring between the programming gate and the variable resistance channel. This may enable decoupled read-write operations of the device. This may enable operating the device as a nonvolatile electrochemical memory cell.

An embodiment of the metal containing reservoir may include materials such as $CeO_x$, $WO_x$, $TiO_x$, CuOx, $AlO_x$, $TaO_x$, and $HfO_x$. This may enable operating the device as a nonvolatile electrochemical memory cell.

An embodiment of the ion exchange layer may include materials such as metal oxides. This may enable operating the device as a nonvolatile electrochemical memory cell.

An embodiment of the ion exchange layer may include materials such as HfOx and TaOx. This may enable operating the device as a nonvolatile electrochemical memory cell.

An embodiment of the variable resistance channel may include materials such as WOx, TiOx, VOx, TaOx, HfOx. This may enable operating the device as a nonvolatile electrochemical memory cell.

An embodiment of the invention may include a memory structure. The memory structure may include a first terminal connected to a first contact. The memory structure may include a second terminal connected to a second contact and a third contact. The memory structure may include a multi-level nonvolatile electrochemical cell having a variable resistance channel and a programming gate. The memory structure may include the first contact and second contact connected to the variable resistance channel. The memory structure may include the third contact is connected to the programming gate. This may enable decoupled read-write operations of the device.

An embodiment of the programming gate may include using an ion exchange layer as the programming gate. This may enable operating the device as a nonvolatile electrochemical memory cell.

An embodiment of the programming gate may further include a metal-containing reservoir. This may enable operating the device as a nonvolatile electrochemical memory cell.

An embodiment of the ion exchange layer may include materials such as metal oxides. This may enable operating the device as a nonvolatile electrochemical memory cell.

An embodiment of the ion exchange layer may include materials such as HfOx and TaOx. This may enable operating the device as a nonvolatile electrochemical memory cell.

An embodiment of the variable resistance channel may include materials such as WOx, TiOx, VOx, TaOx, HfOx. This may enable operating the device as a nonvolatile electrochemical memory cell.

An embodiment of the metal containing reservoir may include materials such as $CeO_x$, $WO_x$, $TiO_x$, CuOx, $AlO_x$, $TaO_x$, and $HfO_x$. This may enable operating the device as a nonvolatile electrochemical memory cell.

An embodiment of the invention may include writing to a memory structure. Writing to the memory structure may include creating a voltage between a first terminal and a second terminal of a multi-level nonvolatile electrochemical cell. The voltage may cause electrons to move through a channel of the multi-level nonvolatile electrochemical cell. The voltage may cause an electric field across a charge-exchange layer thereby causing ions to move along that electric field into the multi-level nonvolatile electrochemical cell. In this embodiment, the direction of movement of ions across the charge-exchange layer is different from the direction of movement of electrons along the variable resistance channel. This may enable decoupled read-write operations of the device.

An embodiment of the charge exchange layer may include a metal oxide layer located in contact with the variable resistance channel. This may enable operating the device as a nonvolatile electrochemical memory cell.

An embodiment of the charge exchange layer may include a metal containing reservoir. This may enable operating the device as a nonvolatile electrochemical memory cell.

An embodiment of the memory structure may include the first contact in contact with a first portion of the variable resistance channel. The memory structure may include the second contact in contact with a second portion of the variable resistance channel. The memory structure may include the third contact is in contact with the charge-exchange layer. This may enable decoupled read-write operations of the device.

An embodiment of the invention may include writing to a memory structure. Writing to the memory structure may include creating a voltage between a first terminal and a second terminal of a multi-level nonvolatile electrochemical cell. The voltage may cause electrons to move through a channel of the multi-level nonvolatile electrochemical cell. The voltage may cause an electric field across a charge-exchange layer; however, the field is not sufficient to cause ions to move along that electric field into the multi-level nonvolatile electrochemical cell. In this embodiment, the direction of movement of ions across the charge-exchange layer is different from the direction of movement of electrons along the variable resistance channel. This may enable decoupled read-write operations of the device.

An embodiment of the charge exchange layer may include a metal oxide layer located in contact with the variable resistance channel. This may enable operating the device as a nonvolatile electrochemical memory cell.

An embodiment of the charge exchange layer may include a metal containing reservoir. This may enable operating the device as a nonvolatile electrochemical memory cell.

An embodiment of the memory structure may include the first contact in contact with a first portion of the variable resistance channel. The memory structure may include the second contact in contact with a second portion of the variable resistance channel. The memory structure may include the third contact is in contact with the charge-exchange layer. This may enable decoupled read-write operations of the device.

Figure 1:
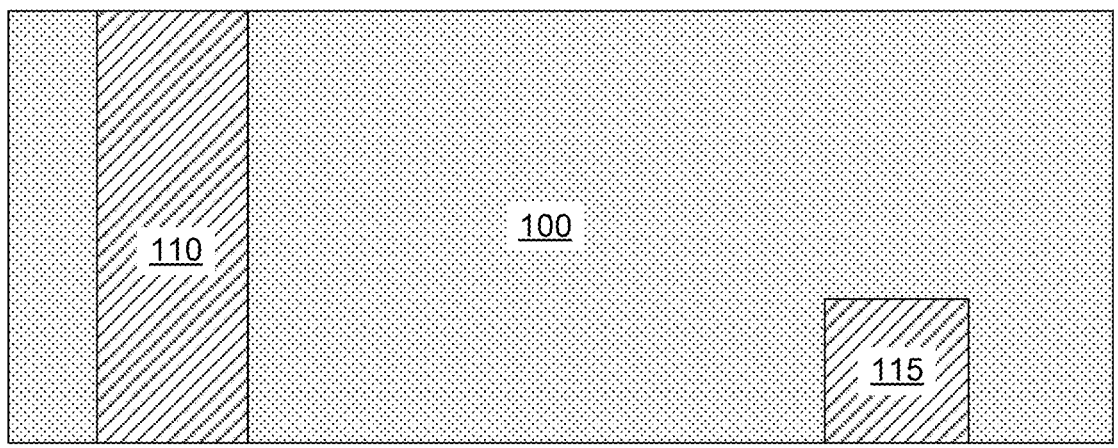
FIG. 1 depicts a top-down view of a channel terminal and a conductive pedestal located in an insulating layer, according to an example embodiment.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Analog resistive memory devices may use mechanisms of ion transfer during write operations to impact the resistance of the overall memory device during read operations. Such devices may enable migration of conductive ions into a dielectric region, thereby increasing the conductivity through the dielectric, or alternatively may enable migration of ions containing holes into a conductive region, thereby reducing the conductivity of the conductive region. However, read and write paths of these devices overlap, leading to breakdown of the dielectric, read disturb, and overall operational stochasticity of the device. By decoupling the read path and write path during operations, such issues may be reduced, as the flow of current through the devices is not required to move through a dielectric layer of the device.

However, decoupling of read and write paths would typically require additional wiring to the device, as well as additional transistors to signal the device, thereby increasing the footprint of structures needed to operate the device. By providing separate contacts to the memory cell for read and write paths, while maintaining a common terminal for the read and write contacts, the footprint of the structures may be reduced, while maintaining decoupled read and write paths for the resistive analog memory device.

Figure 2:
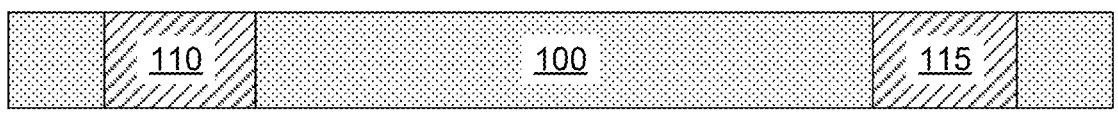
FIG. 2 depicts a cross-sectional view of the channel terminal and the conductive pedestal located in the insulating layer, according to an example embodiment.

Referring to FIG. 1, a top-down view of a channel terminal 110 and a conductive pedestal 115 located in an $M_x$ dielectric 100 is depicted. Referring to FIG. 2, a cross-sectional view of the channel terminal 110 and the conductive pedestal 115 located in the $M_x$ dielectric 100 is depicted. The $M_x$ dielectric 100 may be formed on a sub structure (not shown), and may be formed using any suitable dielectric deposition techniques. The $M_x$ dielectric 100 may be silicon nitride, silicon oxide, silicon oxynitride, or any other suitable low-k dielectrics. The deposited dielectric can be etched to form the regions that will contain the channel terminal 110 and the conductive pedestal 115 by any appropriate lithographic process. The channel terminal 110 and the conductive pedestal 115 can be formed from metal or a metal nitride. In one or more embodiments of the present invention the channel terminal 110 and the conductive pedestal 115 are made using titanium at a thickness of about 5 nm or platinum at a thickness of about 50 nm, but it should be understood that any appropriate material and thickness can be used, including for example tungsten, nickel, molybdenum, tantalum, copper, silver, gold, ruthenium, iridium, rhenium, rhodium, and alloys thereof. In one or more embodiments of the present invention the channel terminal 110 and the conductive pedestal 115 can be formed by an appropriate physical vapor deposition (PVD) process, whereby a sputtering apparatus can include electron-beam evaporation, thermal evaporation, direct-current diode systems, radio frequency sputtering, magnetron sputtering, or ionized metal plasma sputtering. Following deposition of the material for the channel terminal 110 and the conductive pedestal 115, chemical mechanical polishing (CMP) may remove any material above the $M_x$ dielectric 100, forming a substantially planar surface between the $M_x$ dielectric 100, the channel terminal 110, and the conductive pedestal 115.

Figure 3:
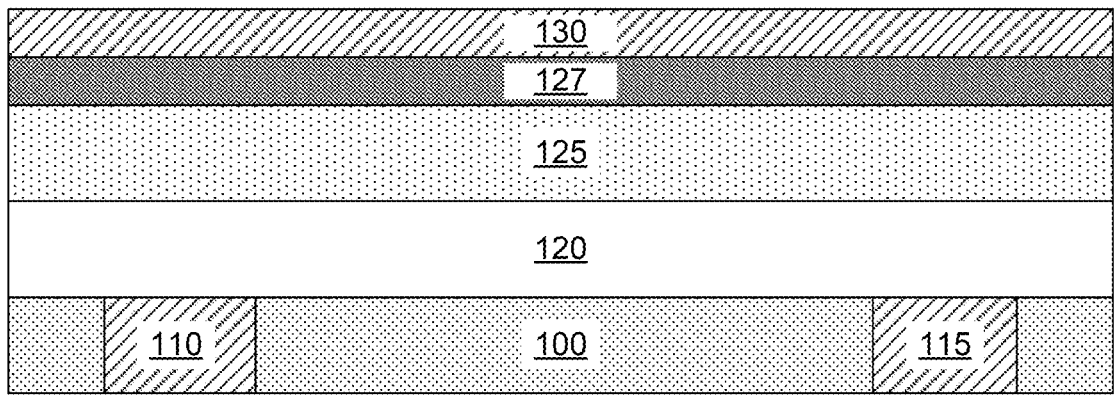
FIG. 3 depicts a cross-sectional view following deposition of a channel material layer, an ion exchange material layer, and a reservoir metal layer, according to an example embodiment.

Referring to FIG. 3, formation of a channel material layer 120, an ion exchange material layer 125, a reservoir layer 127, and a contact layer 130 is depicted. In one or more embodiments of the present invention the channel material layer 120 is formed from a variable-resistance material that changes resistance based on its oxygen or hydrogen content and is composed of metal-oxides such as WOx, TiOx, VOx, TaOx, HfOx. For example, the variable-resistance material can be WO3, TiO2, HfO2, Ta2O5, VxOy, and their sub-oxides. The channel material layer 120 can be formed by any appropriate deposition process such as, for example, PVD, ALD, and CVD. For example, a metal-oxide layer about 50 nm thick can be formed by sputtering, or a layer of about 40 nm thick can be formed by electron beam evaporation. The channel material layer 120 can be made 1-50 nm in thickness in some examples.

A ion exchange material layer 125 may be formed on the channel material layer 120. The ion exchange material layer 125 may be formed using a dielectric material composed of a metal-oxide such as HfOx or TaOx in their sub-oxide or stoichiometric form, for example, $HfO_2$, $Ta_2O_5$, and their sub-oxides. The ion exchange material layer 125 can be of a thickness between 1-50 nm. The ion exchange material layer 125 must have a resistance/cm$^2$ 10× to orders of magnitudes higher than the resistance/cm$^2$ of the channel 120. The ion exchange material layer 125 can be formed using chemical vapor deposition (CVD), PVD, or atomic layer deposition (ALD).

It should be noted that described herein are some possible carriers and effects yielding reversible tunability of the device, however, in other examples different techniques may be used. The charge exchange can include non-metallic ions (oxygen, hydrogen) modifying the resistivity of the channel material layer 120. The charge exchange, in one or more examples, can include electron/holes building up static charge in ion exchange material 125 and affecting carrier dynamic in the channel. For example, the channel material layer 120 accepts additional oxygen ions by intercalation, where the oxide material creates a crystalline structure and additional oxygen ions (e.g., $O^{2-}$) fit into gaps in that crystalline structure under an appropriate voltage. The voltage overcomes the repulsive force created by any electrical charge already present in the channel material layer 120, forcing more charged ions to occupy that layer.

In one or more embodiments of the present invention a reservoir layer 127 is formed on the metal-oxide charge transfer layer ion exchange material 125. In one or more embodiments of the present invention it is specifically contemplated that the reservoir layer 127 is a metal-oxide reservoir layer that is formed from any appropriate oxygen-containing material where oxygen ions readily dissociate under an applied voltage. One example embodiment, the material for the metal-oxide reservoir layer is cerium oxide ($CeO_2$), which reversibly converts to a nonstoichiometric oxide by emitting oxygen ions when subjected to an appropriate voltage. In one specific example, the metal-oxide reservoir layer can be formed from cerium oxide at a thickness of less than 100 nm by a thermal evaporation process. The thickness of the metal-oxide reservoir layer can be in a predetermined range. Other oxides capable of oxygen exchange such as but not limited to $WO_3$, $TiO_2$, CuOx, $Al_2O_3$, $Ta_2O_5$, $HfO_2$, their metals or their suboxides. The metal-oxide reservoir can also be formed using ALD, PVD, CVD, diffusion, or any other process. The metal-oxide reservoir can be a hydrogen reservoir in other examples and is composed of suitable material.

In one or more examples, the contact layer 130 is formed from an oxygen scavenging metal, for example, Al, Be, Mg, Ca, Sr, Ba, Sc, Y, La, Ti, Zr, Hf, Dy, Lu, Er, Pr, Ce. The oxygen scavenging material can also be an alloy material such as Ti-rich TiN, TiN/Al(C)/TiN TiN/TiAl(C)/TiN, TiN/Ti(C). Alternatively, in one or more embodiments of the present invention, the contact layer 130 is made of a material that is inert with respect to the oxygen vacancy exchange, for example, TiN, TaN, W. Alternatively, in one or more embodiments of the present invention, the contact layer 130 is made of a material that is a hydrogen catalyst or source.

In case a scavenging material is used, the contact layer 130 produces vacancies in the oxide layers underneath. Because existence of such vacancies in at least one of the layers of the device during operation facilitates the exchange of non-metal ions (oxygen ions), sub-stoichiometric oxide(s) result from one or more of the following: layer(s) deposited as sub-stoichiometric, chemical reaction with the scavenging write electrode, electro-forming by current-induced local heating. A potentiation between the channel 121, the channel terminal 110 and the conductive pedestal 115, and the contact layer 130, yield oxygen (vacancy) exchange between the channel 121 and the insulating ion exchange layer 126 (similar to an electrolyte).

The contact layer 130 is of a predetermined thickness, for example, of about 100 nm using thermal evaporation. It should be noted that the contact layer 130 can be made using any other oxygen scavenging material using any appropriate process other than those described herein.

Figure 4:
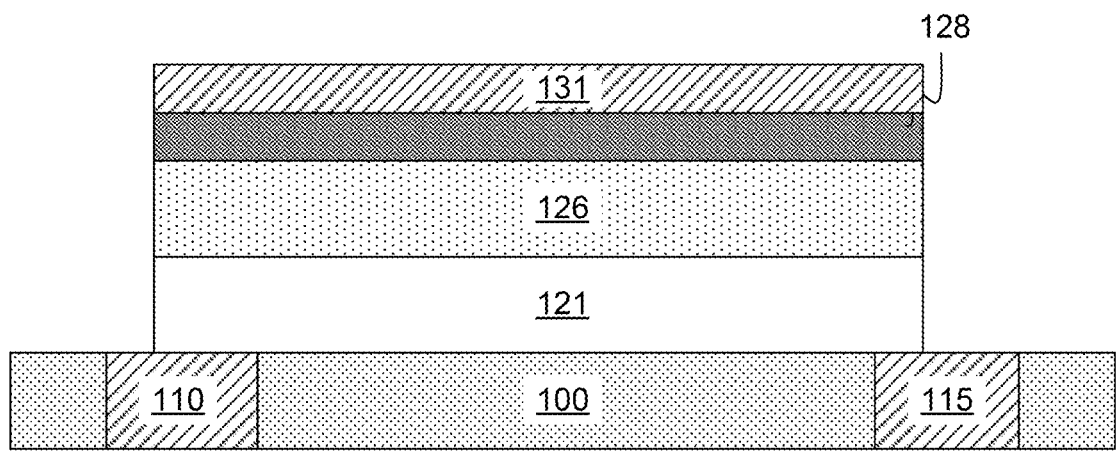
FIG. 4 depicts a cross-sectional view following formation of a memory cell, according to an example embodiment.

Referring to FIG. 4, formation of a memory cell containing a channel 121, an ion exchange layer 126, a reservoir 128, and a top contact 130 from the channel material layer 120, the ion exchange material layer 125, the reservoir layer 127, and the contact layer 130, respectively, is depicted. The formation of the memory cell may be accomplished by applying a lithographic pattern to the top of the stack, followed by an anisotropic etch, such as RIE, to remove the unpatterned portions of the stack.

Figure 5:
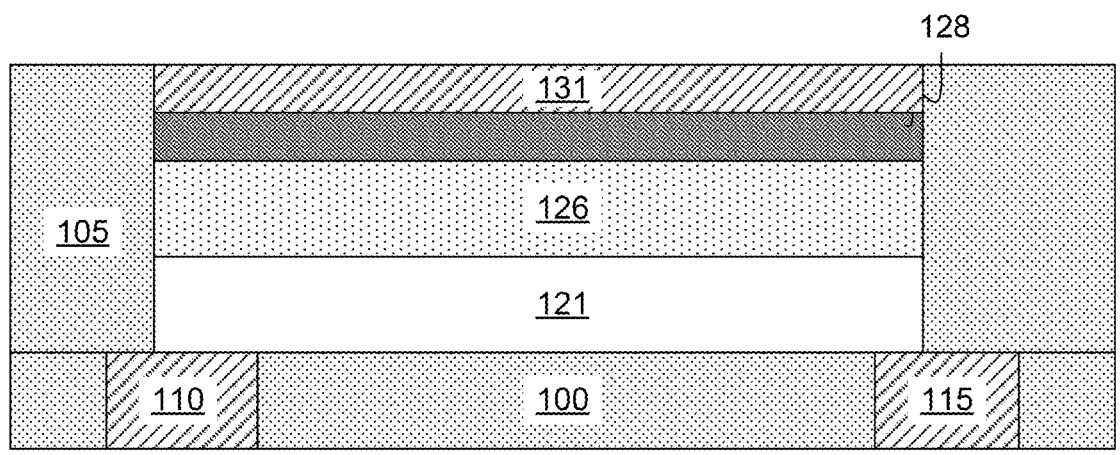
FIG. 5 depicts a cross-sectional view following deposition of a dielectric layer, according to an example embodiment.

Referring to FIG. 5, formation of a $M_{x+1}$ dielectric layer 105 is depicted. The $M_{x+1}$ dielectric layer 105 may be formed using any suitable dielectric deposition techniques followed by chemical mechanical polishing (CMP) to planarize the $M_{x+1}$ dielectric layer 105 with the reservoir 128. The $M_{x+1}$ dielectric 105 may be silicon nitride, silicon oxide, silicon oxynitride, or any other suitable low-k dielectrics.

Figure 6:
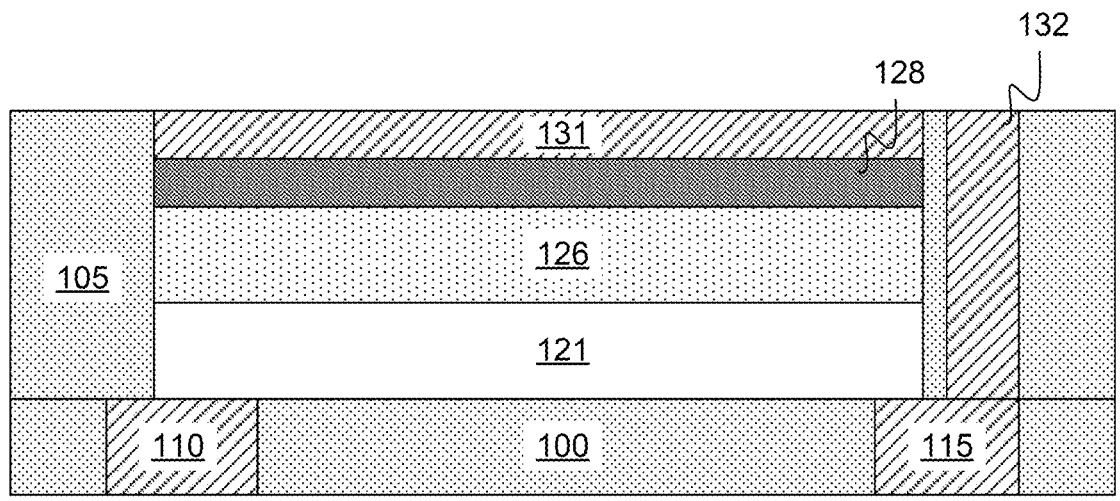
FIG. 6 depicts a cross-sectional view following formation of a top contact and a pedestal contact, according to an example embodiment.

Referring to FIG. 6, formation a pedestal contact 132 is depicted. The pedestal contact 132 forms a connection between the top surface and pedestal 115, so that the top contact 131 and pedestal 115 may be electrically connected. In one or more examples, the pedestal contact 132 is formed from the same material as the conductive pedestal 115 such as, for example, titanium, tungsten, nickel, molybdenum, tantalum, copper, silver, gold, ruthenium, iridium, rhenium, rhodium, and alloys thereof.

Figure 7:
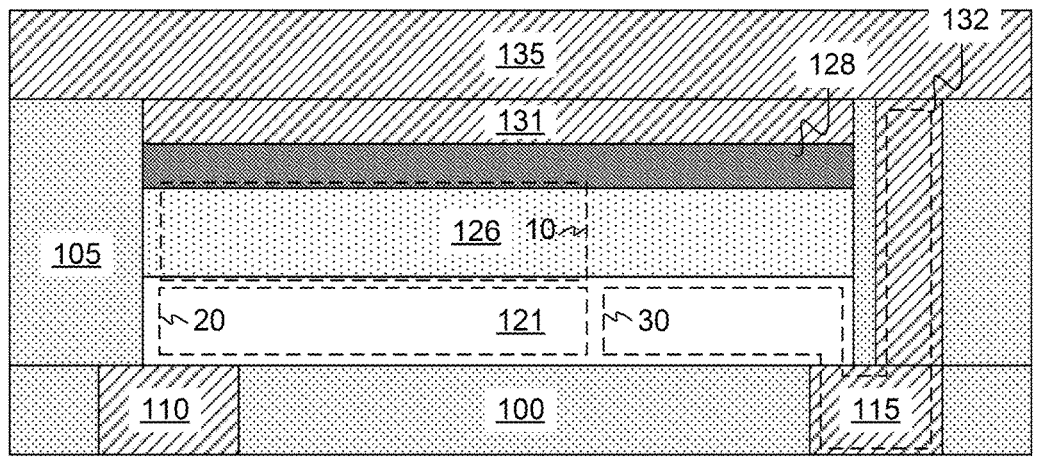
FIG. 7 depicts a cross-sectional view following formation of a common terminal connecting the top contact and the pedestal contact, according to an example embodiment.
Figure 9:
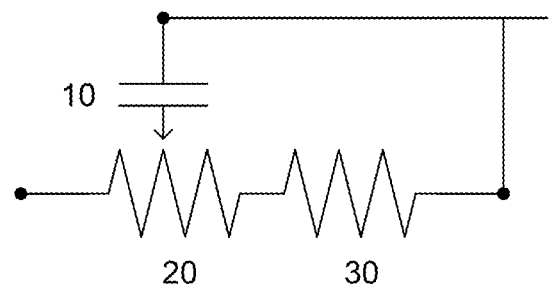
FIG. 9 depicts an electrical wiring diagram describing the operation of the memory cell, according to an example embodiment.

Referring to FIG. 7, depicts forming a common terminal 135 connecting the top contact 131 and the pedestal contact 132. The common terminal 135 may be formed within a dielectric layer (not shown), using similar materials and techniques as the formation of the channel terminal 110 and the conductive pedestal 115 in the $M_x$ dielectric 100. The common terminal 135 may be part of a wordline. Additionally, as illustrated in FIG. 9, the structure may include a programming gate 10 (or charge exchange layer), a variable resistor 20, and a fixed resistor 30. A programming gate 10 may be the portion of the ion exchange layer 126 capable of transferring ions into the channel 121, having a gate electrode that includes either reservoir 128 or top contact 131. A variabile resistor 20 may be a portion of the channel 121, and location of the variable resistor may be based on the location where ions may be transferred from the ion exchange layer 126. A fixed resistor 30 may include a portion of the channel 121 not in contact with the programming gate, as well as pedestal 115 and pedestal contact 132.

Figure 8:
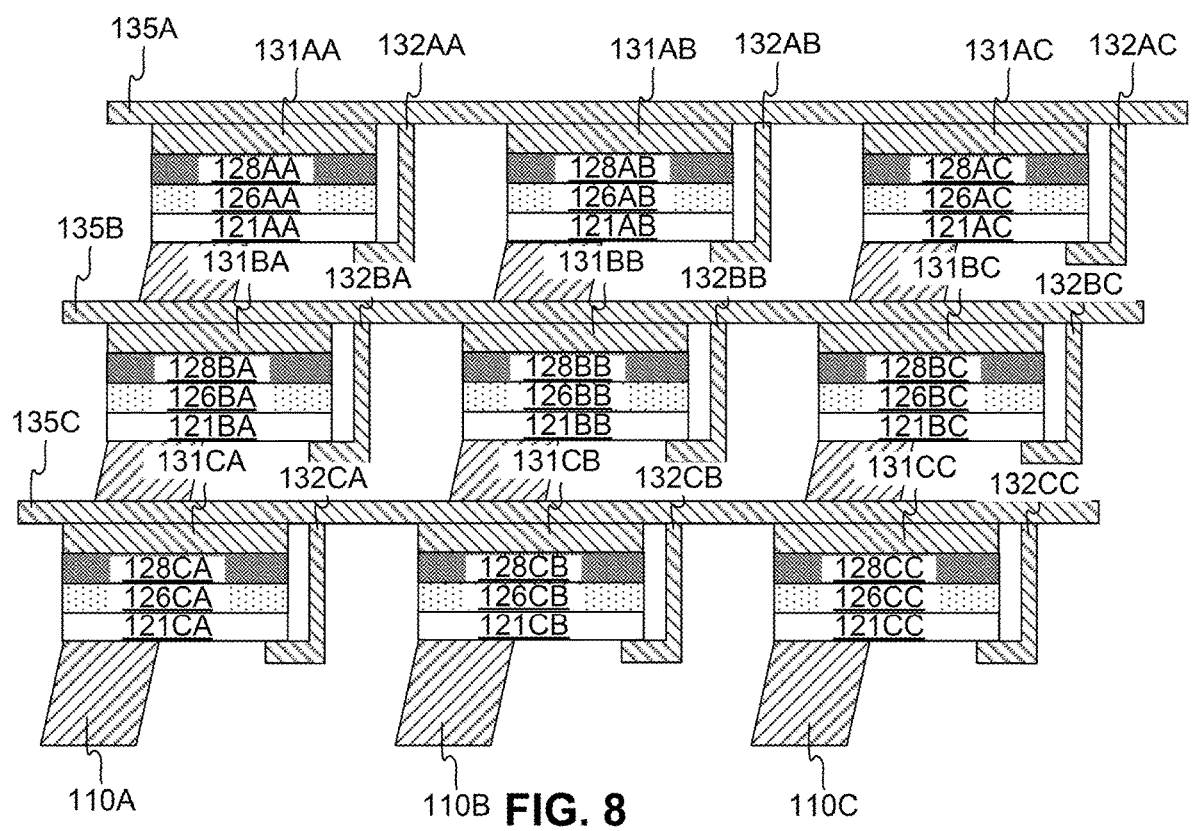
FIG. 8 depicts a plurality of memory cells arranged in a cross-point array, according to an example embodiment.

Referring to FIG. 8, the memory cell of FIG. 7 is depicted as part of a cross-point array, as may be used in analog computing. In this embodiment, the common terminal 135 may be a part of a word line 135A/B/C, while the channel terminal 110 may be a part of a bit line 110 A/B/C. Each junction of a word line 135A/B/C and bit line 110A/B/C may include a memory cell as depicted in FIG. 7.

Figure 10:
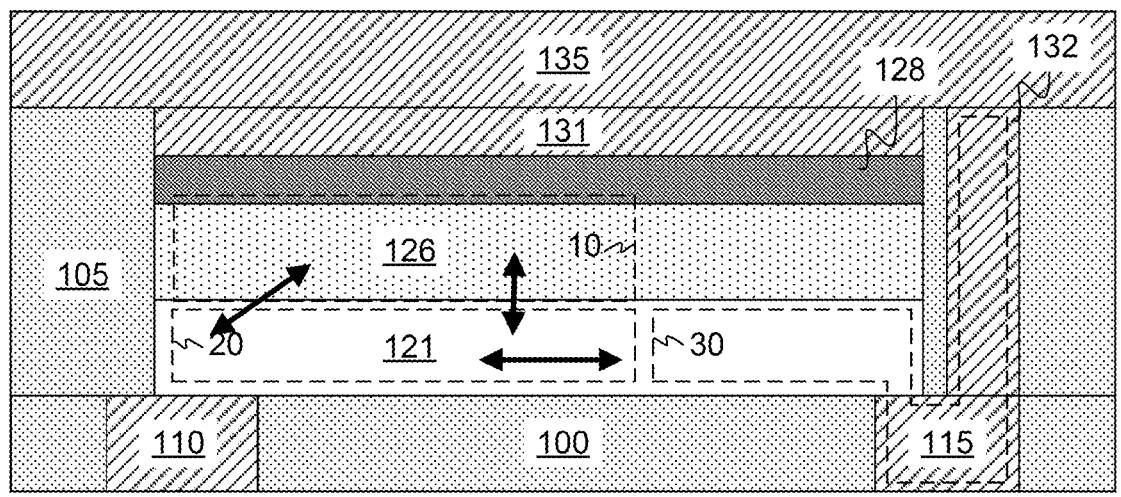
FIG. 10 depicts a movement of charged elements through the memory cell during a write operation, according to an example embodiment.
Figure 11:
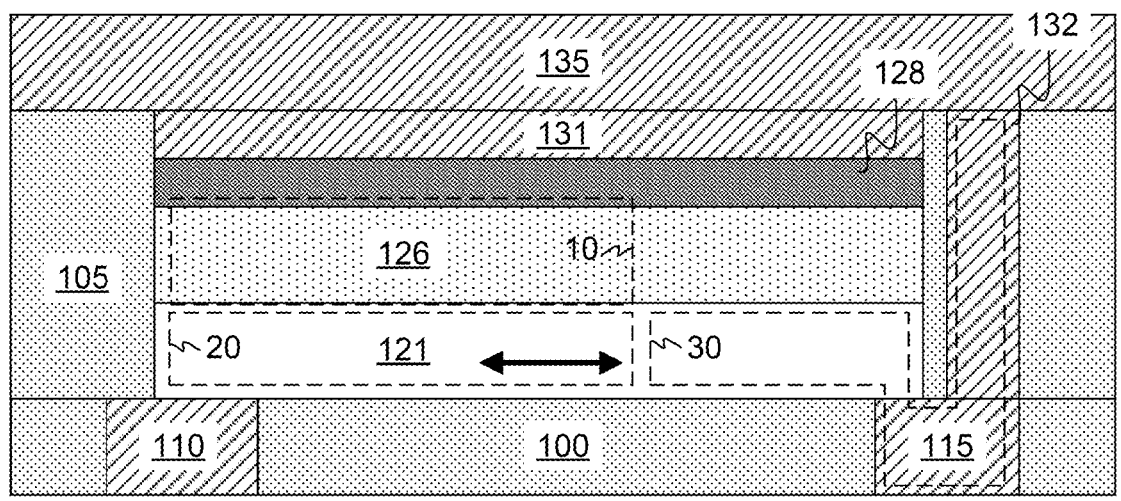
FIG. 11 depicts a movement of charged elements through the memory cell causing a read operation, according to an example embodiment.
Figure 12:
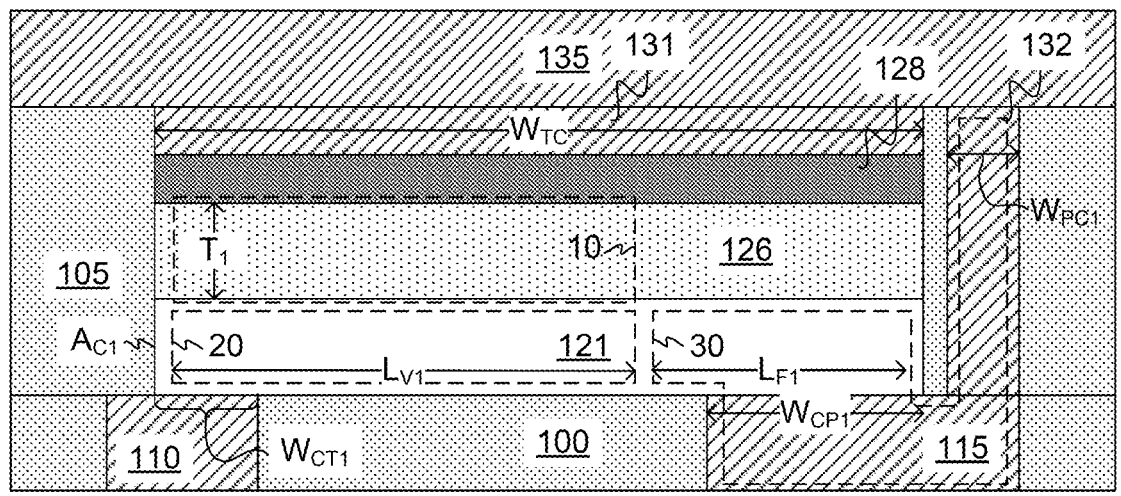
FIG. 12 depicts a first example embodiment of the memory cell, according to an example embodiment.
Figure 13:
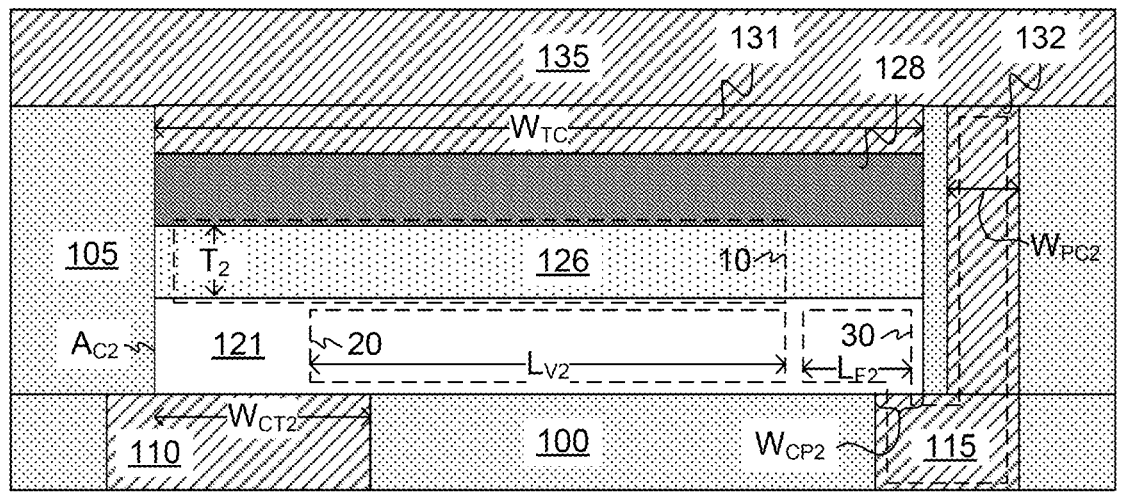
FIG. 13 depicts a second example embodiment of the memory cell, according to an example embodiment.

Referring to FIG. 9, an electrical wiring diagram of the memory cell is depicted. The cell may include a programming gate 10, a variable resistor 20, and a fixed resistor 30. Referring to FIGS. 10-12, the elements of the electrical wiring diagram of FIG. 9 are superimposed on a first example embodiment of the memory cell. Referring to FIG. 13, the elements of the electrical wiring diagram are superimposed on a second example embodiment of the memory cell. As described below, the electrical characteristics of the cell may be adjusted based on the patterning and design parameters used forming the cell. It should be noted that the location of the electrical elements on the drawings are approximate and intended to illustrate the concept, without being an exact representation of the characteristics and operation of the device.

Referring to FIG. 10, a write operation is depicted. During this operation, first voltage is applied across the common terminal 135 and channel terminal 110. The first voltage is selected so that a sufficient potential is created between the top contact 131 and the channel 121, which may cause non-metal ions, for example oxygen ions, to migrate between the channel 121 and the ion exchange layer 126. For example, a first voltage may be about 1V to about 5V. Such migration of ions allows the memory device to produce a movement of ions that is not in the direction of current flow during a read operation. Additionally, because the top contact 131 is electrically connected to the conductive pedestal 115 via the common terminal 135 and pedestal contact 132, current will flow between the conductive pedestal 115 and channel terminal 110. It should be noted that the arrows depicted in FIG. 10 show the movement of ions from ion exchange layer 126, as well as the flow of current along channel 121.

Referring to FIG. 11, flow of current through the memory cell during a read operation is depicted. During a read operation, a second voltage may be used which is substantially less than the first voltage. For example, a second voltage may be about 50 mV to about 250 mV. The resulting change of resistance of the channel 121 may be measured based on the flow of current between the channel terminal 110 and the conductive pedestal 115. It should be noted that voltage for measurement may be substantially less than the write conditions, such that the movement of ions described with respect to FIG. 10 does not occur.

Referring to FIG. 12 and FIG. 13, 2 different embodiments of the memory device are depicted to illustrate how possible changes in geometry may achieve different electrical characteristics of the device. The resistance of fixed resistor 30 may be used to tune the write characteristics of the memory cell. The resistance of the fixed resistor 30 in the channel 121 may be dependent on the material, fixed length $L_{F1}$ or $L_{F2}$ and the channel cross-sectional area $A_{C1}$ or $A_{C2}$ of the channel 121. In such a system, the fixed length $L_{F1}$ or $L_{F2}$ may be the portion of the channel 121 that does not experience ion migration into, or out of, the material during operation. The fixed length $L_{F1}$ or $L_{F2}$ may be based on the portion of the 131 conductive pedestal 115 in contact with the channel 121 (e.g., $W_{CP1}$ or $W_{CP2}$), as this may be a factor in where ion migration does not substantially occur from the ion exchange layer 126 into the channel 121. Thus, adjustment of the fixed resistor 10 in the channel layer 121 may be tuned by adjusting the thickness of the channel 121 or size and placement of the conductive pedestal 115 131. The fixed resistor 30 may also include a resistance component based on the conductive pedestal 115 and pedestal contact 132. For example, dimensions of the pedestal contact 132, as well as material used for the pedestal contact 132, may be adjusted to the resistance. Further, the width $W_{PC1}$ or $W_{PC2}$ of the pedestal contact may be adjusted to increase or decrease resistance of the fixed resistor 10.

The capacitance of the programming gate 10 may be dependent on the material, the thickness of the ion exchange layer $T_1$ or $T_2$ and the area of the capacitive element, which may be related to the length of the variable resistor $L_{V1}$ or $L_{V2}$. The capacitance, and structure, of the programming gate 10 may impact the rate of ion mobility into the variable resistor 20 during write operations, as well as the voltage across the programming gate 10 required to perform write operations.

The resistance of the variable resistor 20 is dependent on the fixed parameters of the material, length $L_{V1}$ or $L_{V2}$ and the cross-sectional area $A_{C1}$ or $A_{C2}$ of the channel layer 121, as well as a dynamic concentration of mobile ions from the ion exchange layer 126. The length of the variable resistor 20, $L_{V1}$ or $L_{V2}$, may be dependent on the contact area between the channel 121 and channel terminal 110, $W_{CT1}$ or $W_{CT2}$. The dynamic concentration is based on programming of the unit cell, as depicted in FIG. 10.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A memory structure comprising:
a first terminal connected to a first contact;
a second terminal connected to a second contact and a third contact;
a multi-level nonvolatile electrochemical cell, wherein the first contact and the second contact are connected to a variable resistance channel of the multi-level nonvolatile electrochemical cell, and wherein the third contact is connected to a programming gate of the multi-level nonvolatile electrochemical cell.

2. The structure of claim 1, wherein the programming gate comprises an ion exchange layer located on the variable resistance channel.

3. The structure of claim 1, wherein the programming gate comprises a metal-containing reservoir.

4. The structure of claim 2, wherein a material of the ion exchange layer comprises a metal oxide.

5. The structure of claim 4, wherein the metal oxide is selected from a group consisting of: HfOx and TaOx.

6. The structure of claim 1, wherein a material for the variable resistance channel is selected from a group consisting of: WOx, TiOx, VOx, TaOx, HfOx.

7. The structure of claim 3, wherein a material of the reservoir is a metal-oxide is selected form the group consisting of: $CeO_x$, $WO_x$, $TiO_x$, $CuO_x$, $AlO_x$, $TaO_x$, and $HfO_x$.

8. A method of writing to a memory structure comprising:
creating a voltage between a first terminal and a second terminal of a multi-level nonvolatile electrochemical cell,
wherein the voltage causes electrons to move through a variable resistance channel of the multi-level nonvolatile electrochemical cell,
wherein the voltage causes an electric field across a charge-exchange layer thereby causing ions to move along that electric field in the multi-level nonvolatile electrochemical cell, and
wherein a direction of movement of ions across the charge-exchange layer is different from the direction of movement of electrons along the variable resistance channel.

9. The method of claim 8, wherein the charge exchange layer comprises a metal oxide layer located in contact with the variable resistance channel.

10. The method of claim 8, wherein the charge exchange layer further includes a metal containing reservoir layer.

11. The method of claim 10, wherein the first terminal is connected to a first contact in contact with a first portion of the variable resistance channel, wherein the second terminal is connected to a second contact and a third contact, wherein the second contact is in contact with a second portion of the variable resistance channel, and wherein the third contact is attached at an opposite surface of the charge exchange layer from the variable resistance channel.

12. A method of reading a memory structure comprising:
creating a voltage between a first terminal and a second terminal of a multi-level nonvolatile electrochemical cell,
wherein the first terminal is connected to a first contact of the multi-level nonvolatile electrochemical cell,
wherein the second terminal is connected to a second contact and a third contact of the multi-level nonvolatile electrochemical cell,
wherein the voltage causes electrons to move through a variable resistance channel of the multi-level nonvolatile electrochemical cell, and
wherein the voltage causes an electric field across a charge-exchange layer of the multi-level nonvolatile electrochemical cell, and wherein the voltage is not sufficient enough to cause movement of ions into the variable resistance channel.

13. The method of claim 12, wherein the charge-exchange layer comprises a metal oxide layer located in contact with the variable resistance channel.

14. The method of claim 12, wherein the charge-exchange layer further includes a metal containing reservoir layer.

15. The method of claim 12, wherein the first terminal is connected to the first contact in contact with a first portion of the variable resistance channel, wherein the second terminal is connected to the second contact and the third contact, wherein the second contact is in contact with a second portion of the variable resistance channel, and wherein the third contact is attached at an opposite surface of the charge exchange layer from the variable resistance channel.

16. A memory structure comprising:
a first terminal connected to a first contact;
a second terminal connected to a second contact and a third contact;
a multi-level nonvolatile electrochemical cell, wherein the first contact and the second contact are connected to a variable resistance channel of the multi-level nonvolatile electrochemical cell, and wherein the third contact is connected to a programming gate of the multi-level nonvolatile electrochemical cell, wherein read and write operations pass between the first terminal and the second terminal through the multi-level nonvolatile electrochemical cell, and wherein a path of the read operation and a path of the write operation are different.

17. The structure of claim 16, wherein the programming gate comprises an ion exchange layer located on the variable resistance channel.

18. The structure of claim 16, wherein the programming gate comprises a metal-containing reservoir.

19. The structure of claim 17, wherein a material of the ion exchange layer comprises a metal oxide.

20. The structure of claim 19, wherein the metal oxide is selected from a group consisting of: HfOx and TaOx.

21. The structure of claim 16, wherein a material for the variable resistance channel is selected from a group consisting of: WOx, TiOx, VOx, TaOx, HfOx.

22. The structure of claim 18, wherein a material of the reservoir is a metal-oxide is selected form the group consisting of: $CeO_x$, $WO_x$, $TiO_x$, CuOx, $AlO_x$, $TaO_x$, and $HfO_x$.

23. The structure of claim 16, wherein the path of the write operation occurs between the programming gate and the variable resistance channel.

24. The structure of claim 16, wherein a path of the read operation occurs along the variable resistance channel.

* * * * *